(12) United States Patent
Bowen

(10) Patent No.: US 9,024,915 B1
(45) Date of Patent: *May 5, 2015

(54) KEYBOARD WITH REFLECTED LIGHT BEAM FINGER DETECTION

(75) Inventor: James Harrison Bowen, Elizabeth City, NC (US)

(73) Assignee: Chelsea Trent, Williams Bay, WI (US)

( * ) Notice: Subject to any disclaimer, the term of this patent is extended or adjusted under 35 U.S.C. 154(b) by 427 days.

This patent is subject to a terminal disclaimer.

(21) Appl. No.: 13/183,605

(22) Filed: Jul. 15, 2011

(51) Int. Cl.
*G06F 3/045* (2006.01)
*G06F 3/02* (2006.01)
*G06F 3/042* (2006.01)

(52) U.S. Cl.
CPC .................................. *G06F 3/0421* (2013.01)

(58) Field of Classification Search
None
See application file for complete search history.

(56) References Cited

U.S. PATENT DOCUMENTS

| | | |
|---|---|---|
| 4,629,884 A | 12/1986 | Bergstrom |
| 4,701,747 A | 10/1987 | Isherwood et al. |
| 5,355,149 A * | 10/1994 | Casebolt ........................ 345/175 |
| 5,378,069 A | 1/1995 | Bowen |
| 5,577,848 A | 11/1996 | Bowen |
| 5,605,406 A | 2/1997 | Bowen |
| 5,707,160 A | 1/1998 | Bowen |
| 5,785,439 A | 7/1998 | Bowen |
| 6,175,679 B1 | 1/2001 | Veligdan et al. |
| 7,417,624 B2 * | 8/2008 | Duff .............................. 345/168 |
| 8,847,923 B1 * | 9/2014 | Bowen ........................... 345/175 |
| 2002/0088697 A1 * | 7/2002 | Stephens ........................ 200/314 |
| 2003/0090470 A1 * | 5/2003 | Wolter et al. .................. 345/170 |
| 2008/0055494 A1 * | 3/2008 | Cernasov ........................ 349/12 |
| 2011/0169743 A1 * | 7/2011 | Oh et al. ....................... 345/169 |

* cited by examiner

*Primary Examiner* — Christopher R Lamb
(74) *Attorney, Agent, or Firm* — Whitham Curtis Christofferson & Cook, PC

(57) ABSTRACT

A keyboard operates by having a light beam reflected off a finger. When present, as indicated by the presence of the reflected light beam, the keyboard key location is sent to a PC or other device. The keyboard can be used in bright sunlight and total darkness. The keyboard has a one piece planar top surface with no opening or microbial (bacterial or viral) harbors.

6 Claims, 9 Drawing Sheets

*FIG. 3*        *FIG. 4*
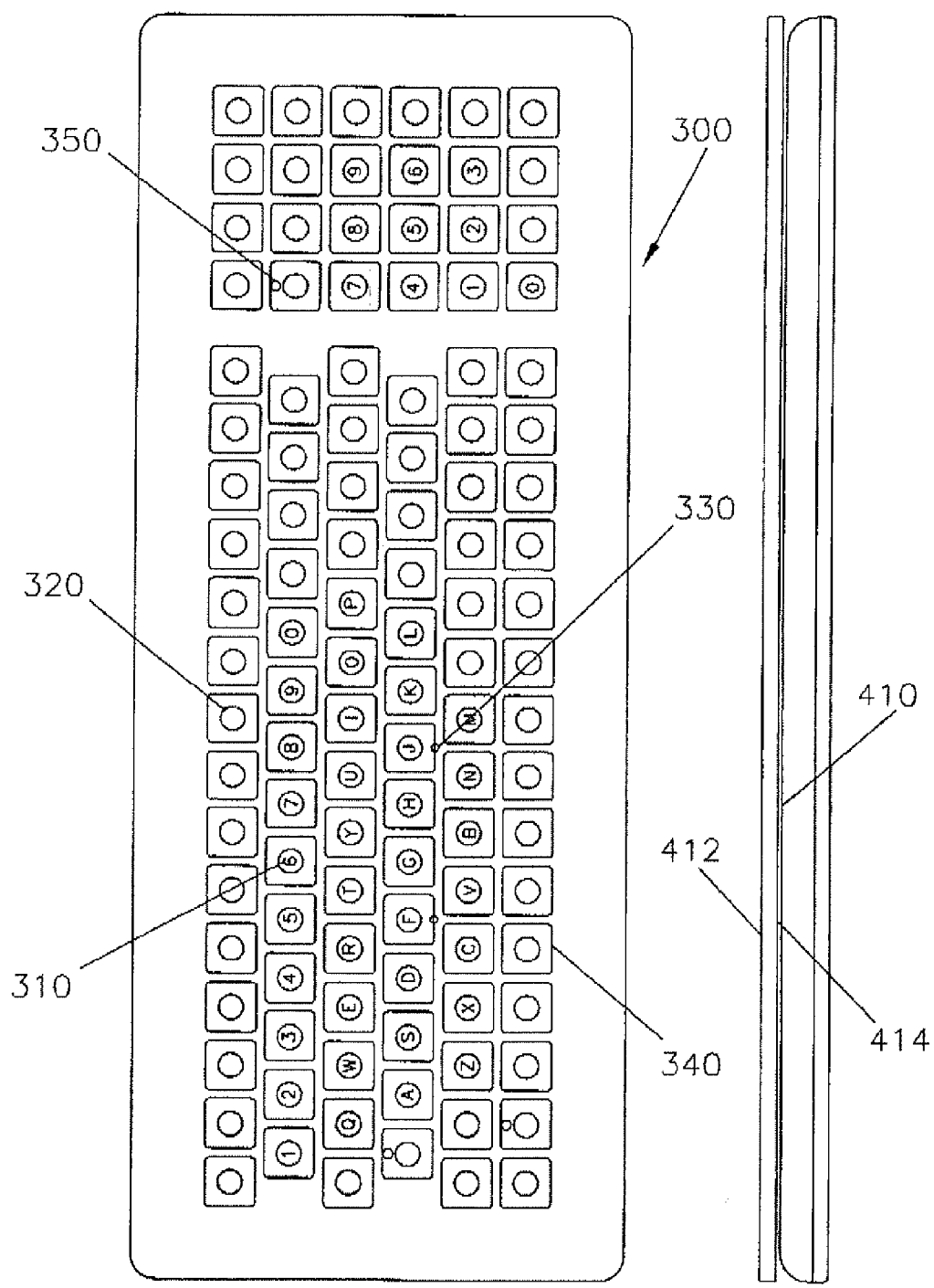

KEYBOARD WITH REFLECTED LIGHT BEAM FINGER DETECTION

BACKGROUND OF THE INVENTION

1. Field of the Invention

The present invention generally relates to a standalone input device or keyboard with a planar top surface with no openings or cracks. The input device or keyboard will be used with a personal computer (PC), control panels for operating equipment, and for data input in rugged environments where an internal light beam is emitted out through an optical opening into bright sunlight ambient or total darkness. When a finger is present, the finger encompasses or otherwise covers the opening, thereby substantially blocking out the ambient light from being detected by an internal detector. When the emitter is turned on, the emitted beam is reflected off the finger to the detector which will indicate that a finger is present.

2. Description of the Prior Art

Optical keyboards sometimes use techniques to reduce the ambient lighting effect on finger detection. However, these optical keyboards when used in bright sunlight where bright sunlight saturates the photodiodes do not perform well. Nothing stops the light saturation of the intense ambient lighting in bright sunlight unless, for example, the user moves to a location under an awning or the like. Similarly, in total darkness where the user cannot see the key indicia, these prior optical keyboards fail to perform well. In addition, these prior optical keyboards lack a planer top surface, which is required for cleaning and other purposes in industrial, atomic and medical environments.

U.S. Pat. No. 6,175,679 Veligdan et al shows a keyboard with stacked waveguides to detect a finger.

U.S. Pat. No. 4,629,884 Bergstom shows the use of a radiation propagating prism to detect a finger.

U.S. Pat. No. 4,701,747 Isherwood shows a keyboard where a light beam from a LED reflects to a photodiode when a finger is present, and includes a noise and ambient light rejection circuitry. Unfortunately, Isherwood does not have a design that can accommodate one piece construction and would therefore be unsuitable in environments where nuclear or microbial contaminants could fit in the edges of the various pieces used to make the keyboards. Also, the circuitry for ambient rejection in Isherwood is not conducive to use in bright sunlight.

U.S. Pat. Nos. 5,378,069, 5,577,848, 5,605,406, 5,707,160, and 5,785,439 all to Bowen shows keyboards that detect an users finger by blocking an X and Y optical beam.

SUMMARY OF THE INVENTION

The invention pertains to a keyboard where a light beam is reflected off a finger to detect a keyboard key location (i.e., a selected key), wherein the keyboard can be used in bright sunlight and total darkness, and wherein the keyboard has no openings or cracks in the keyboard top surface that otherwise might harbor nuclear, microbial (e.g., bacteria), or other detrimental contaminants.

An exemplary embodiment of the invention provides a keyboard or input device configuration where an internal light beam is emitted out through a opening into an ambient, where in high ambient lighting (e.g., bright sunlight, etc.) when a finger is present, the finger encompasses (covers) the opening, substantially blocking out the ambient influence on a detector and reflecting the unabated beam from the finger to the detector. Circuitry using the reflected beam with the absence of the ambient light is used to determine that a finger is present. This small opening is about the size of the finger print area of a user's finger, or about ten mm in diameter.

Another embodiment of the invention has a LED of a different wave length than that used for the finger detection emitter and photo detection diode. The LED emits a visible light beam to show the key indicia in dark environments, thus allowing a user to see the key location in the dark.

Still another embodiment of this invention has the keyboard top surface configured as a planar one piece top surface with no opening or cracks. With a planar, one piece top surface, atomic contaminates, medical contaminates, or fluids, or other contaminates that generally cannot be easily cleaned are rendered more easy to clean due to the planar top surface, and the keyboard is rendered more suited to use in certain industrial environments where contaminants are a problem (e.g., atomic energy environments; clinics; research facilities, etc.). This is very advantageous because the size of nuclear molecule is so small even the smallest crack or even a decal on the top surface can harbor nuclear contaminates or microbes (e.g., bacteria or viruses).

Yet another embodiment of this invention employs a calibration where the dark count from the photo detector is stored and finger detection scanning is not started until this calibration level, or a derivative thereof, is reached.

Another embodiment of this invention detects changing ambient light to automatically change the output intensity of the key indicia LED output so the key indicia is always readable by the user.

Yet another embodiment of this invention has the threshold of the photo detector be variable to ambient changing lighting. Scanning for a finger is performed prior to reaching the calibration level.

Still another embodiment of the invention is to have no finger detection moving parts, thereby facilitating long operational life.

BRIEF DESCRIPTION OF THE DRAWINGS

The foregoing and other objects, aspects and advantages will be better understood from the following detailed description of the invention with reference to the drawings, in which:

FIG. 3 shows a top view of a keyboard with a plastic housing with a plurality of key location openings for light beam finger detection in accordance with the teachings of this invention;

FIG. 4 shows a front view of the keyboard in FIG. 3 with a planar top surface and calibration tool for dark ambient in accordance with the teachings of this invention;

DETAILED DESCRIPTION OF THE INVENTION

Figure 1:
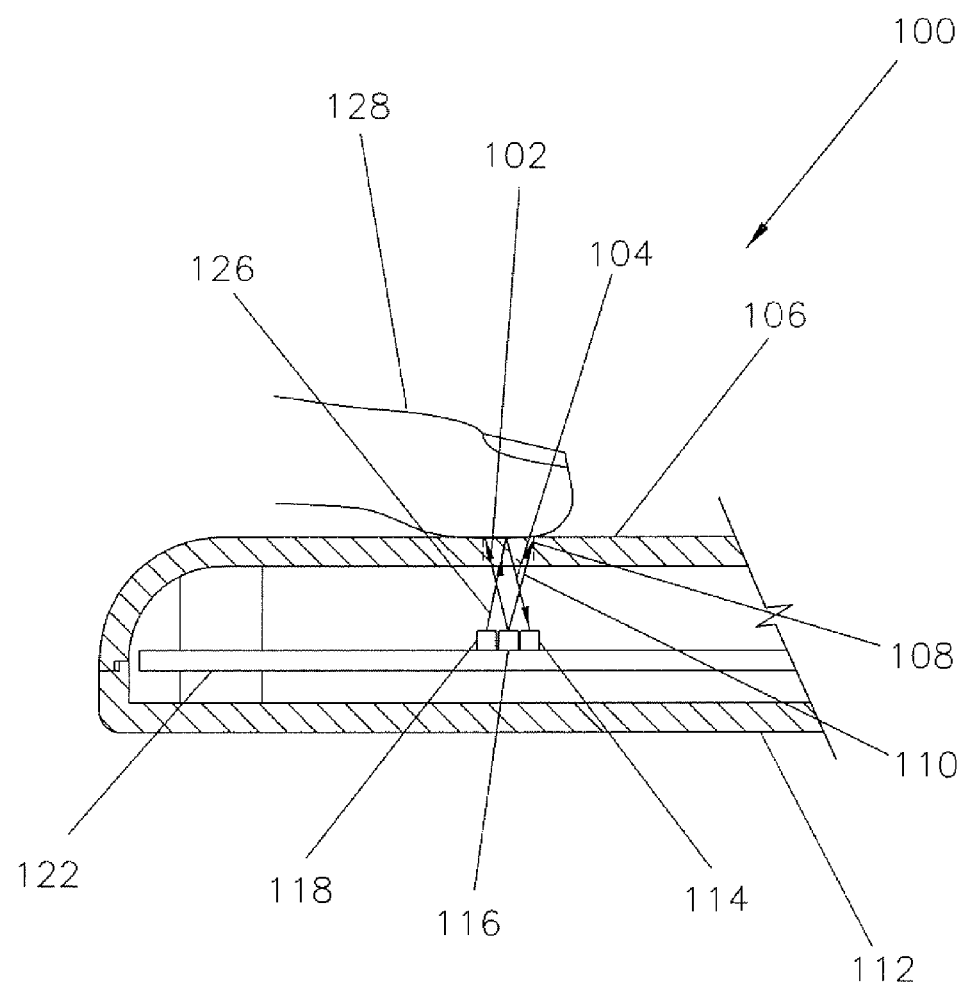
FIG. 1 shows a finger placed on a key location with printed or molded key indicia of a keyboard with one piece plastic top housing having an emitted light beam reflected off a finger to a detector when a finger is present in accordance with the teachings of this invention.

Referring now to the drawings, FIG. 1 shows a keyboard 100 with a one piece planar top cover 106 forming the upper housing of keyboard 100 with an operator's finger 128 placed over an opening 108 to substantially block ambient light from influencing the performance of the detector 114 or emitter 118. Output of emitter 118 is reflected, as shown by reflecting output beam 126, to photo detector 114, as shown by reflected beam 104. Center LED emitter 116 outputs a beam shown by arrows 110 and 102 to illuminate the key indicia printed on top cover 106 so a user in low light ambient can see the key indicia (not shown) when looking at the top cover 106. Lower housing 112 covers printed wiring board 122 that provides connection circuitry for emitter 118, photo detector 114, and LED emitter 116. Output emitter 118 and detector 114 are generally of the 800 to 950 wave length in the infrared (IR) region, and the LED emitter 116 is generally in the visible wave length for the colors that a user may specify (e.g., a user may prefer red, yellow, green or other colors). Opening 108 is shown by dotted lines to show it is only an optical opening area that could be formed from a printed ink surround and is not a physical opening or hole, i.e., it is just an area that permits light to pass through from LED emitter 116 and light from emitter 118 to pass through when no finger is present or to be reflected towards the photo detector 114 when a finger is present. Top cover 106 is generally substantially thin and transparent or, to some degree translucent, in nature but which is substantially IR transparent. The top cover 106 could be constructed of an IR transparent material and be reduced in thickness at the opening 108 location to allow visible emittance from LED emitter 116 to show or highlight key indicia to a user looking at the top of the top cover 106. Having a one piece top cover 106 is very advantageous because the size of nuclear molecules, bacteria, or other contaminants are so small even the smallest crack can hide nuclear contaminates or other contaminants. With medical molecules there can be no crack or holes because when cleaning with cleaners that kill bacteria, or viruses, even though the bacteria or viruses are killed or incapacitated they still may be present in a crack or hole.

Figure 1A:
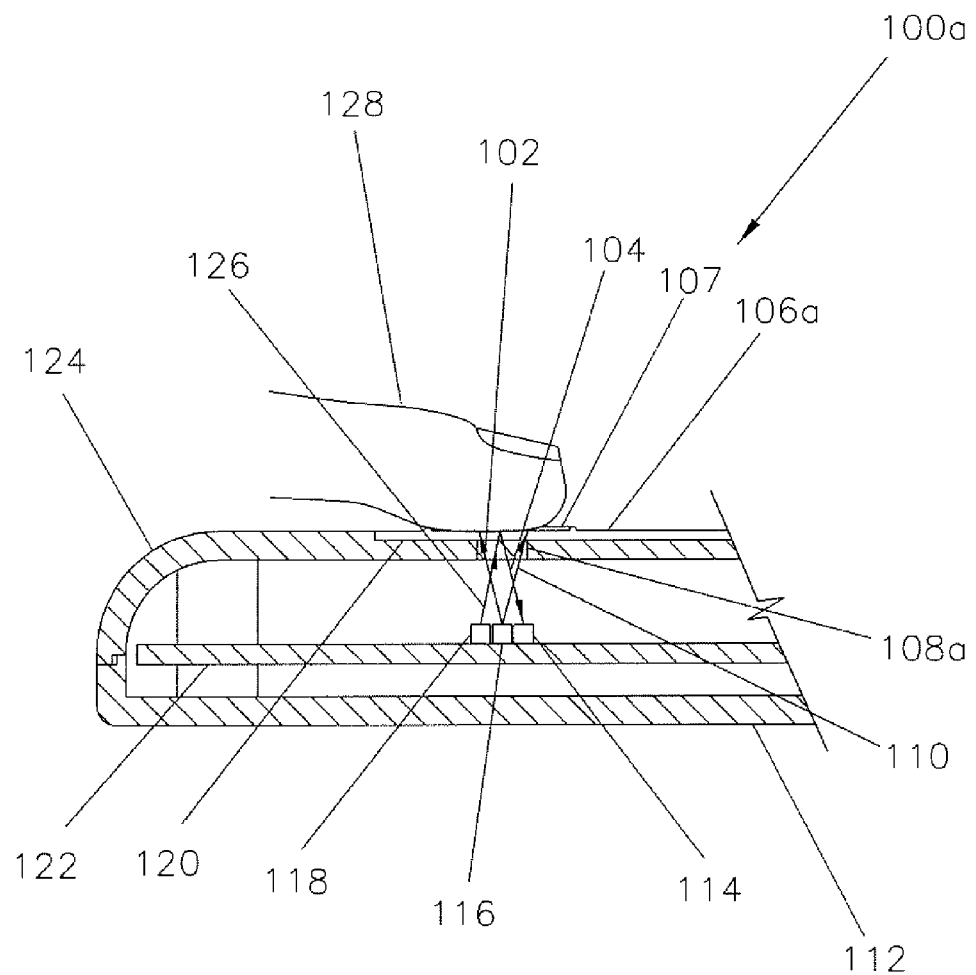
FIG. 1A shows a finger placed on a key location of a keyboard with plastic top housing with an insert with key indicia printed or molded having an emitted light beam reflected off a finger to a detector when a finger is present in accordance with the teachings of this invention.

FIG. 1A is of similar structure of FIG. 1 with like item numbers being the same in both Figures. Keyboard 100a is shown with key indicia insert 106a. The indicia insert 106a has printed or molded key locational text and is located in indicia recess 120. This configuration allows top cover 124 to be constructed of a clear material or of an opaque material. Hole 108a allows emitted beams to reflect off the finger 128 when the finger 128 is touching key indicia insert 106a. Hole 108a would not be needed in top cover 124 if the material of top cover 124 is clear, transparent, or translucent, and, in these situations, hole 108a could more of an "area" as is described for hole 108 in conjunction with FIG. 1. Embossed square 107 may be provided to give tactile locational feel for a user's finger 128. The embossed square 107 may take the form or a very slightly raised square (e.g., one that could be only one to five mils high that protrudes up from planar surface of key insert 106a). The embossed square 107 could also be molded into the keyboard in FIG. 1 (e.g., molded in the keyboard 100 top surface and made small enough so as not to hold or harbor bacteria or other molecular contaminants). These areas of embossed squares are not needed for most users, but can be added for a user preference when needed.

Figure 2:
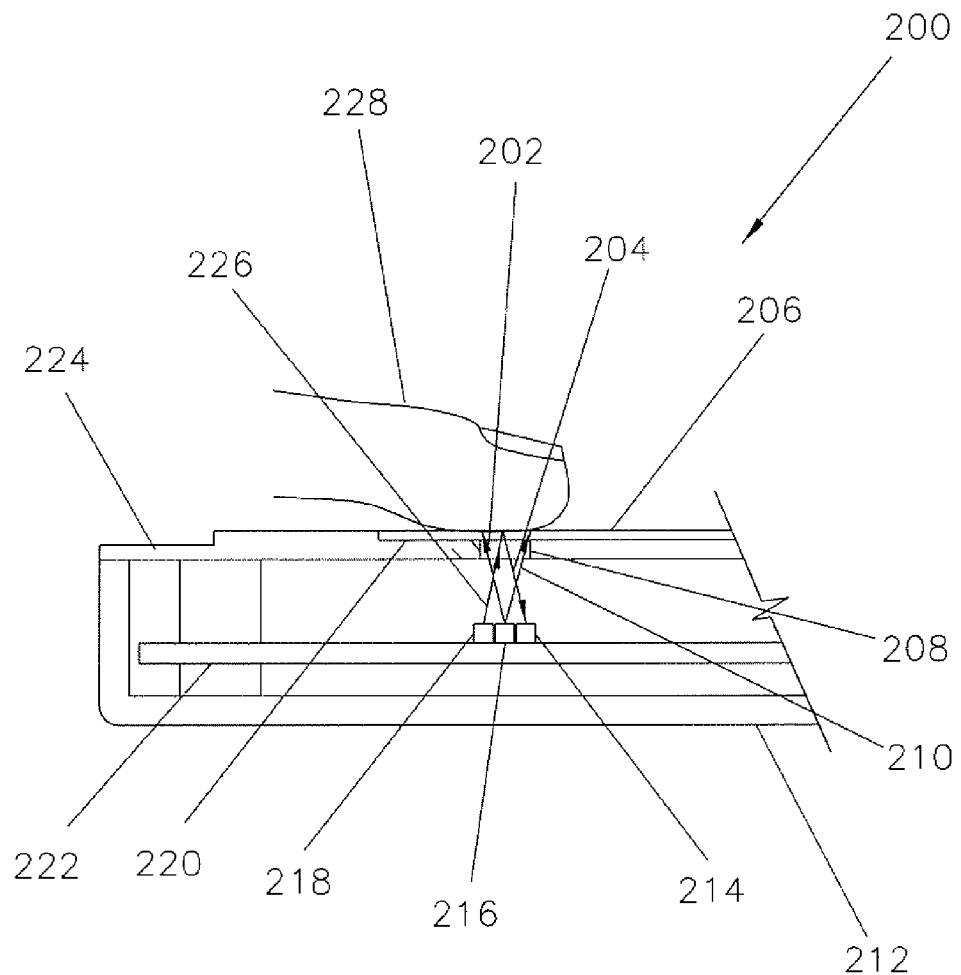
FIG. 2 shows a finger placed on a key location of a keyboard with a metal housing having an emitted light beam reflected off a finger to a detector when a finger is present in accordance with the teachings of this invention.

FIG. 2 shows a keyboard 200 with a top cover 206 forming the upper housing of keyboard 200 with an operator's finger 228 placed over an opening 208 to block ambient light. Similar to FIGS. 1 and 1a, the configuration in FIG. 2 prevents ambient light from influencing the performance of the emitter 218 and detector 214. The output of emitter 118, indicated by output beam 226, is reflected to the photo detector 214, as indicated by the reflected beam 204. It is not always necessary to block all the ambient light from getting to photo detector 214. If the keyboard is used in areas where there is no bright sunlight, then opening 208 can be larger, and the digital signal processing (DSP) of the microprocessor 600 of FIG. 6 can be used to identify and differentiate attenuation caused by the presence the finger 218, thereby allowing the photo detector 214 to more accurately detect the presence of a finger at a location on the keyboard or input device. Center LED emitter 216 outputs a beam shown by arrows 210 and 202 to illuminate the key indicia printed on an insert in recess 220 of top cover 206 so a user in low light ambient can see the key indicia. Lower housing 212 covers printed wiring board 222 which provides connection circuitry for emitter 218, photo detector 214 and LED emitter 216. Output emitter 218 and detector 214 are generally of the 800 to 950 wave length in the IR region, and LED emitter 216 is in the visible wave length region and, in some embodiments can provide different wavelengths for the color that a user may specify to meet their preferences (e.g., red, yellow, green or other color). Opening 208 can be only an optical opening that could be formed from a printed ink surround and not a physical opening or it could be a hole depending on the material used to construct top cover 206. If top cover 206 is molded of a plastic like material, opening 208 could be transparent or translucent. If top cover 206 is machined from metal or a plastic like material which is opaque, opening 208 can be a physical hole. Mounting recess 224 facilitates mounting keyboard 200 into another panel or the like, or into a machine.

FIG. 3 shows a top view of keyboard 300 with a plastic housing and a plurality of key location openings 320 for light beam finger detection with key indicia 310. Tactile raised areas 330 at the base of the J indicia and the F indicia may be included to more easily allow for a user to locate his or her index fingers of the left and ring hand to the key pattern. In addition, key raised areas 340 may also be provided to give tactile feedback which would more easily enable a user to feel the keys. As described in conjunction with FIG. 1a, this can be in the form of an embossing which may be as small as one to five mils in height. As noted previously, these areas may not be needed for most users but can be added for a user preference when needed.

FIG. 4 shows a front view of keyboard 300 of FIG. 3 with a planar top surface 410 and calibration tool 412 when placed over planar top surface 410 and blocks ambient light so a dark ambient calibration value can be stored in the electronics (microprocessor) generally at the factory of manufacture, but could be in the field if necessary if recalibration is needed. Thus, in operation the microprocessor includes a stored "dark ambient calibration" for each of the plurality of light detectors, and this calibration is in the practice of finger detection in one embodiment as discussed in more detail below. In operation, when a detector is scanned and the measured ambient is, e.g, within 25% (or 10% or some other threshold) of the stored dark ambient calibration, the microprocessor would identify this as being substantially equal to the stored dark ambient calibration.

Figure 5:
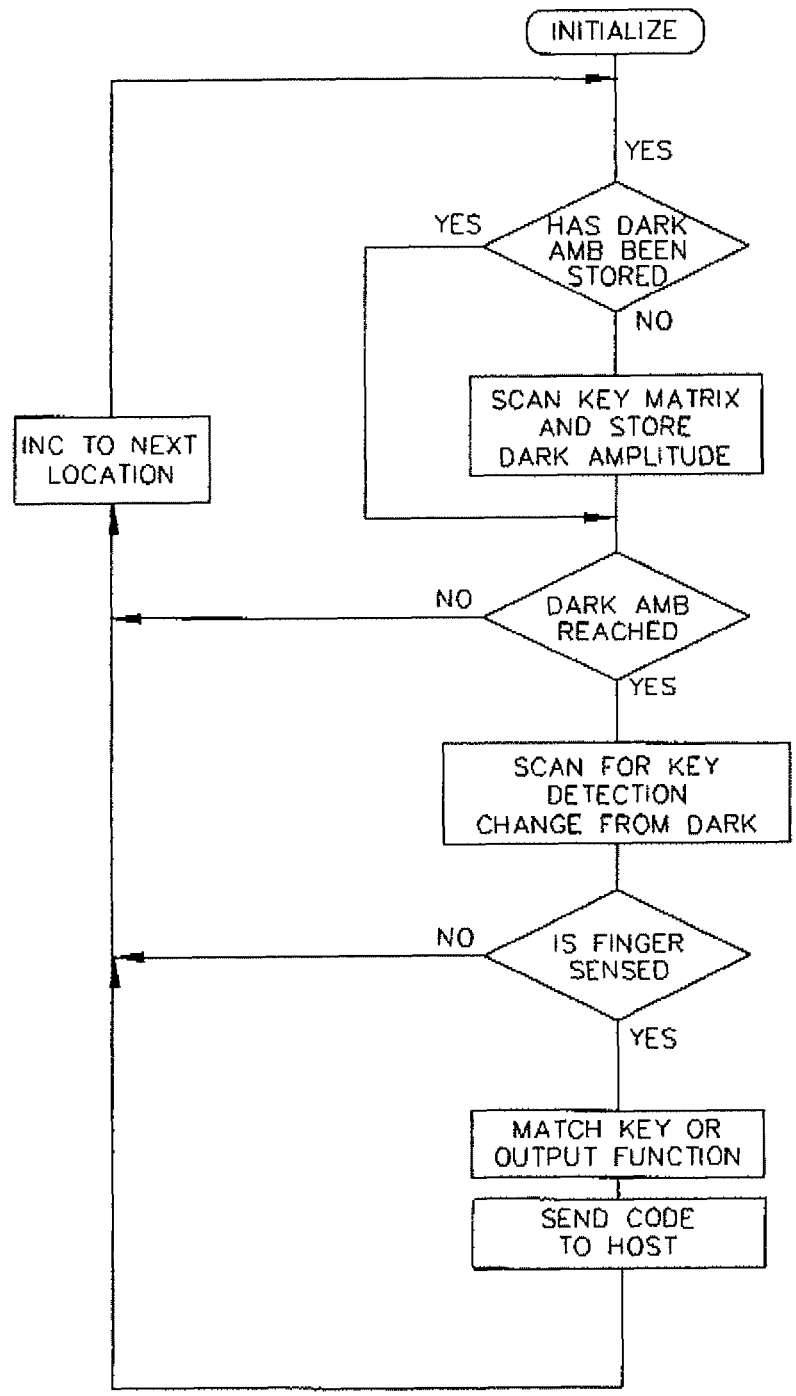
FIG. 5 is a flow chart showing the program in the microprocessor for controlling the keyboard with dark ambient calculation in accordance with the teachings of this invention.

FIG. 5 is a flow chart showing exemplary steps which might be implemented in a computer program that is performed under the control of the microprocessor for controlling the keyboard when dark ambient calibration is used to detect a key position. At INITIALIZE, the processor starts and sets all of the output and input ports to their status and sends start up codes to a host for PS2 or USB. If connected to a serial host, the microprocessor then awaits instructions to start keyboard functions, or continues with PS2 or USB outputs.

If dark ambient is being used, a question HAS DARK AMB BEEN STORED is asked and if needed the process goes to NO and does SCAN KEY MATRIX AND STORE DARK AMPLITUDE, this calibration and storing normally done at the factory and this check is to make sure the dark ambient calibration has been preformed and if not the keyboard stays in a loop not functioning until sent back to the factory for calibration, and then goes to is DARK AMB REACHED meaning if a user's finger has been placed over a key indicia location and blocked the ambient light from the detectors, the amplitude of the detectors would have substantially matched the dark ambient stored threshold. If NO then the process goes to INC TO NEXT LOCATION and looks for the next position, if YES, the scan of the key location would start at SCAN FOR KEY DETECTION CHANGE FROM DARK and the IR emitter would be turned on to see if a reflectance was seen on the IR detector. Then the process goes to IS FINGER SENSED. If a reflectance is seen (this is equated by the microprocessor as a finger being detected), then YES and go to MATCH KEY OR OUTPUT FUCTION and SEND CODE TO HOST and INC TO NEXT LOCATION and return. If at IS FINGER SENSED a reflectance is not seen then got to INC TO NEXT LOCATION and return to scan the next location. This process is continued until all keys on the keyboard are tested and then the process is started again. It should be understood by those skilled in the art that the keyboard could be any number of keys and not only the amount of keys shown in FIG. 3 (e.g., 9 or 16 keypads might be used and operate in a similar manner as cellular phones for messaging applications).

Figure 5A:
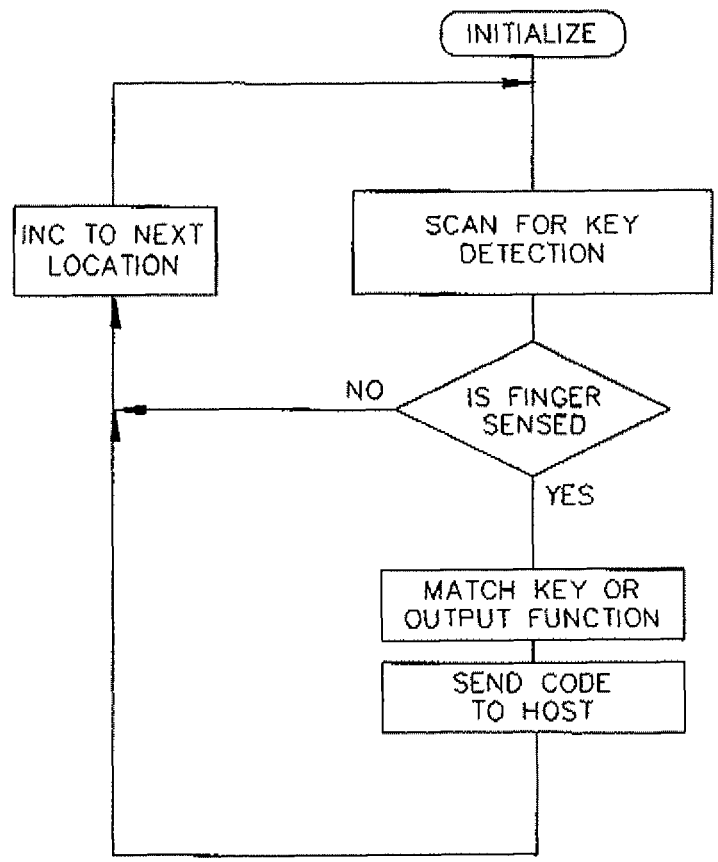
FIG. 5A is a flow chart showing the program in the microprocessor for controlling the keyboard without dark ambient calculation in accordance with the teachings of this invention.

FIG. 5A is a flow chart showing exemplary steps which might be implemented in a computer program that is performed under the control of the microprocessor for controlling the keyboard when dark ambient calibration is not used to detect a key position. At INITIALIZE, the processor starts and sets all of the output and input ports to their status and sends start up codes to a host for PS2 or USB. If connected to a serial host, the microprocessor then awaits instructions to start keyboard functions, or continues with PS2 or USB outputs.

If the keyboard is not going to be used in a dark ambient environment or in bright sunlight then the microprocessor continues to SCAN FOR KEY DETECTION to turn on emitter and check for reflectance to the detector. If a reflectance is detected by the detector then at IS FINGER SENSED the microprocessor must detect a predetermined substantial change with the emitter on and if that test shows this substantial change (e.g., a threshold for the amount of change has been reached or exceeded (e.g., a change of 25% or 50% or some other value)) then this is equated to a finger being detected and continues to MATCH KEY OR OUTPUT FUNCTION. If that change is not enough then the process goes to INC TO NEXT LOCATION and returns to test another position. At MATCH KEY OR OUTPUT FUNCTION the position is matched with the position code and sent to the host at SEND CODE TO HOST, and then to INC TO NEXT LOCATION and return to the next location to be checked. This process is again continued until all keys on the keyboard are tested and then the process is started again. It should be understood by those skilled in the art that the keyboard could be any number of keys and not only the amount of keys shown in FIG. 3 (e.g., 9 or 16 keypads might be used and operate in a similar manner as cellular phones for messaging applications).

Figure 6:
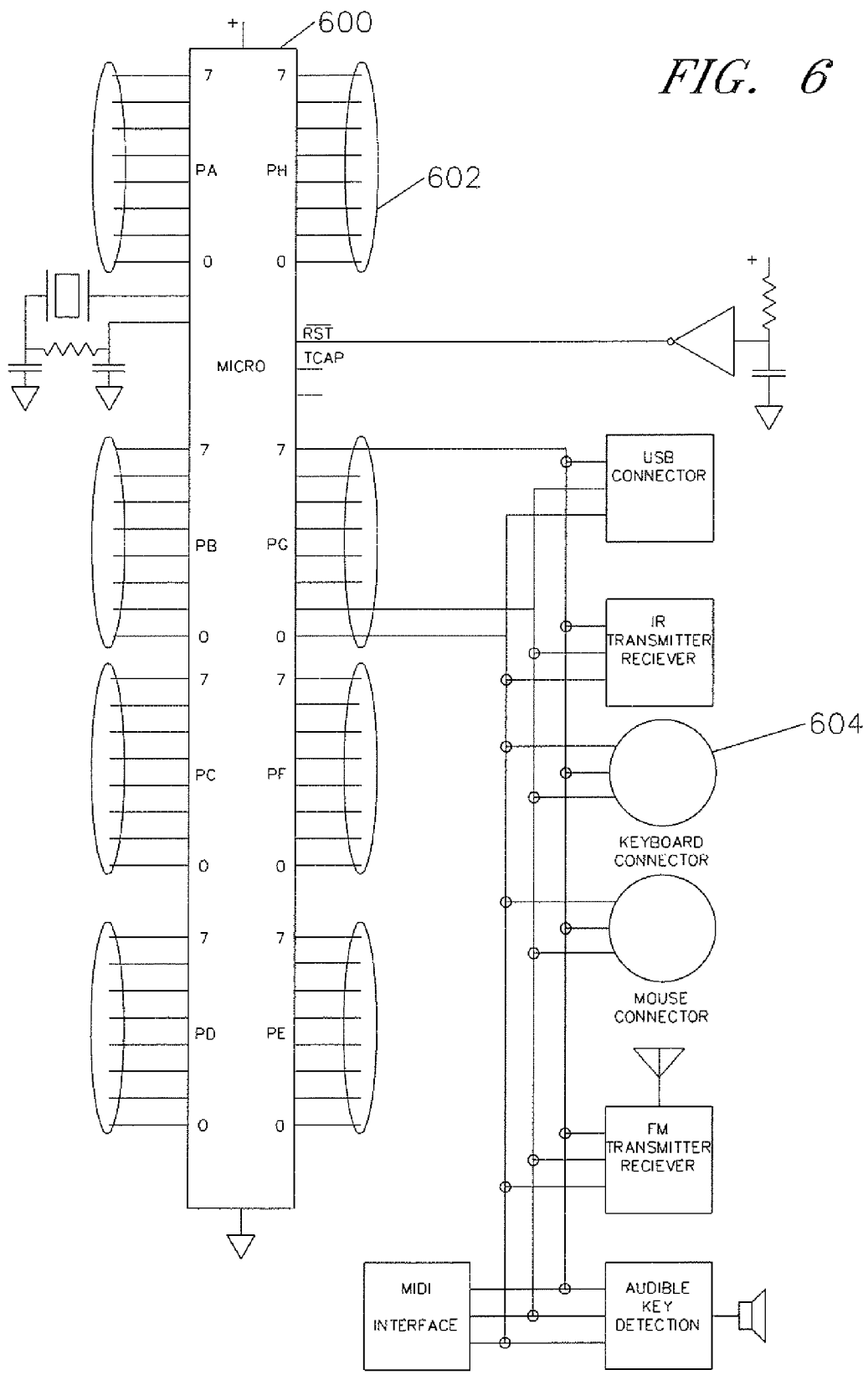
FIG. 6 is a schematic illustrating the microprocessor section of the keyboard in accordance with the teachings of this invention.
Figure 7:
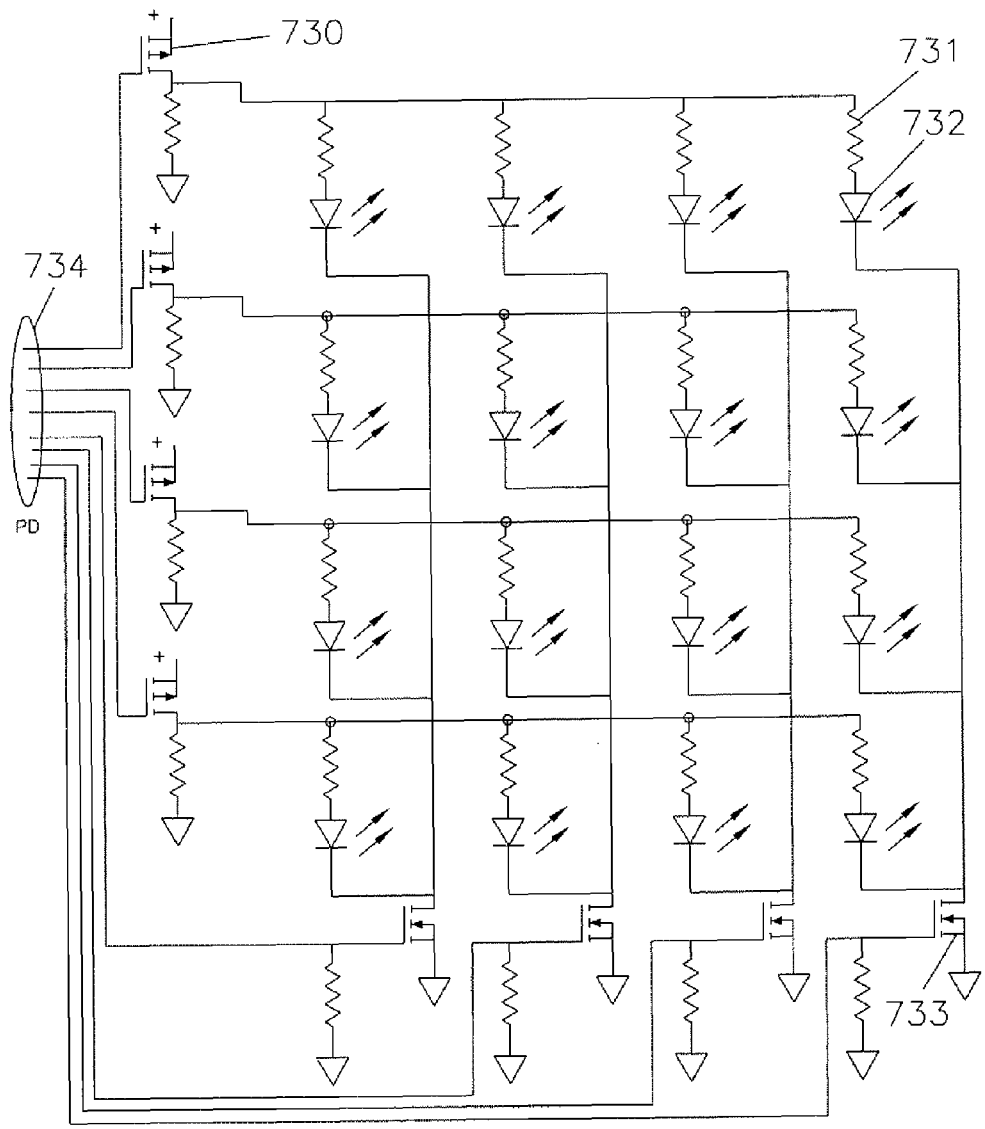
FIG. 7 is a schematic illustrating the emitter output section of the keyboard in accordance with the teachings of this invention.
Figure 8:
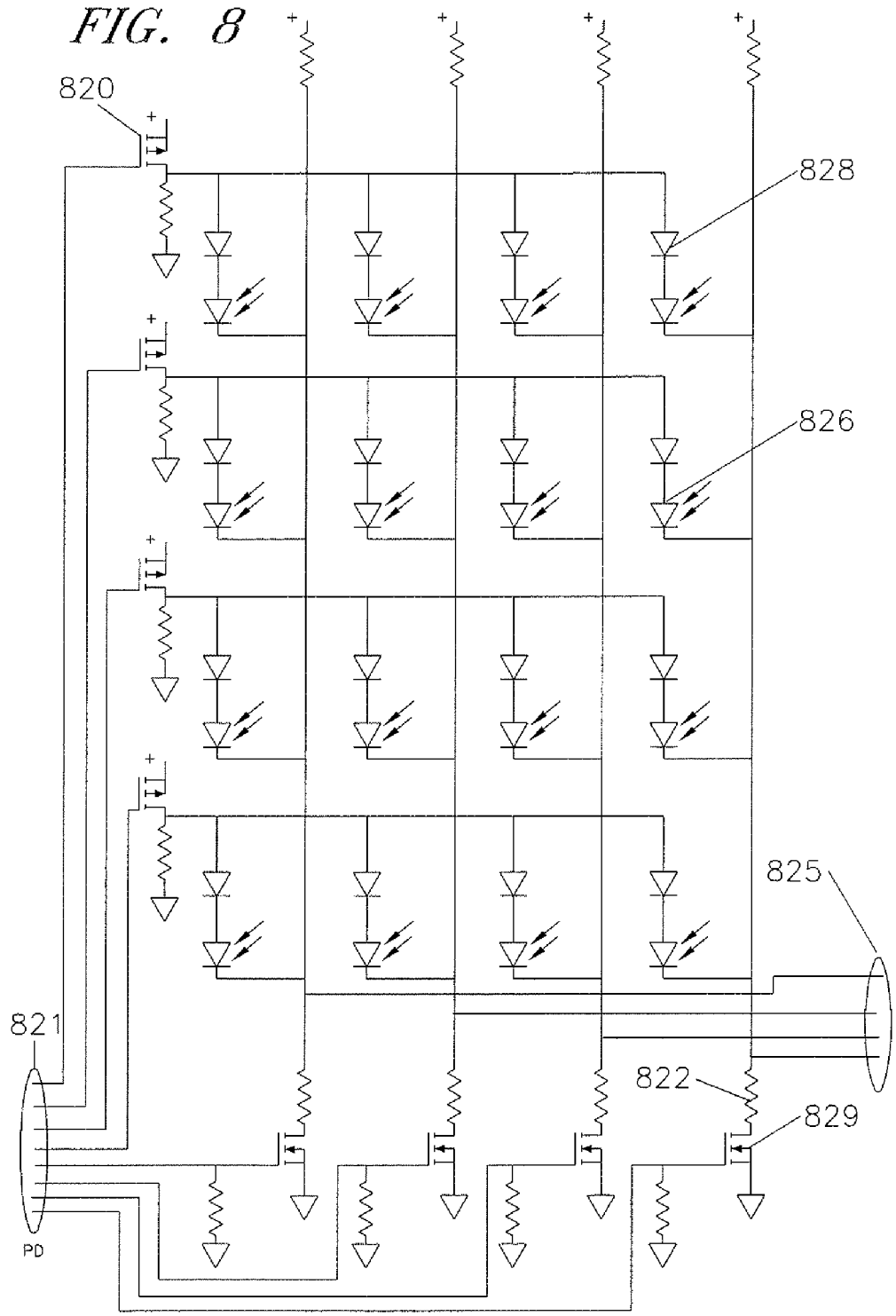
FIG. 8 is a schematic illustrating the detector input section of the keyboard in accordance with the teachings of this invention.

FIG. 6 is a schematic illustrating the microprocessor section of the keyboard with microprocessor 600 connected to and controlling components including without limitation the keyboard connector 604, the inputs and outputs, and the circuits in FIG. 7 and FIG. 8 via, for example, ports like 602.

FIG. 7 is a schematic illustrating the emitter output section of the keyboard being controlled by control inputs 734 and can, for example, for the IR emitters and the LED emitters 732, include a current limiting resistor 731 and be controlled by PFET 730 and NFET 733, and be in a matrix. Depending on the amount of key locations, the matrix could be made larger or smaller with the timing on and off being controlled by the microprocessor of FIG. 6.

FIG. 8 is a schematic illustrating the IR detector input section of the keyboard. Depending on the amount of key locations, the matrix could be made larger or smaller. Digital signal processing (DSP) techniques or absolute detection timing can be controlled by the microprocessor of FIG. 6. Input control 821 and analog output lines 825 are shown for exemplary purposes where the matrix is controlled by PFETS like 820 with blocking diodes 828. IR detectors 826 are on when NFETS 829 are selected to sense outputs analog outputs over current sense resistors 822. The IR emitter attenuates the photo diode and this attenuation is seen over the current sense resistor 822.

It should be appreciated to those skilled in the art that although the Figures herein shows a limited key number that more keys or less keys are only a matter of reducing the size the key matrix or increasing the size of the matrix.

While the invention has been described in terms of its preferred embodiments, those skilled in the art will recognize that the invention can be practiced with modification within the spirit and scope of the appended claims.

Having thus described my invention, what I claim as new and desire to secure by Letters Patent is as follows:

1. A keyboard with reflected light beam finger detection, comprising:
   a plurality of substantially transparent areas;
   a plurality of light emitters and a plurality of light detectors, each light emitter being paired with a light detector whereby emitted light from the light emitter of a pair is intended to be reflected to the light detector of the pair, and wherein pairs of light emitters and light detectors are aligned with and disposed below each of said substantially transparent areas;
   a plurality of visible light emitters aligned with and disposed below each of said substantially transparent areas;
   a microprocessor including a dark ambient value stored for each of said plurality of light detectors, said dark ambient value being substantially equal to a value detected by said light detector at said substantially transparent areas when a finger encompasses said substantially transparent area thereby blocking ambient light to said light detector at said one of said plurality of said substantially transparent areas, said microprocessor being configured to scan said plurality of light detectors and to determine a detected value for each of said plurality of light detectors, wherein when each of said plurality of light detectors is scanned and after said microprocessor determines at least one light detector has a detected value substantially equal to said dark ambient stored by said microprocessor, then an emitter paired with said light detector is turned on, wherein if a value detected by said light detector when said emitter is turned on is substantially equal to said dark ambient value stored by said microprocessor this identification is equated to no finger being detected, and if said value detected by said light detector when said emitter is turned on is substantially different from said dark ambient value this identification is equated to a finger being detected, and said microprocessor provides a key code representative of a location to a host.

2. A keyboard with reflected light beam finger detection as claimed in claim 1 wherein said visible light emitters are diodes.

3. A keyboard with reflected light beam finger detection as claimed in claim 1 further including a ring aligned with each of said plurality of substantially transparent areas protruding up from a top surface of said keyboard.

4. A keyboard with reflected light beam finger detection, comprising:

a keyboard planar top surface of one piece construction free of openings and microbial harbors;

key indicia disposed on said top surface of said keyboard;

said key indicia aligned with a plurality of substantially transparent areas in said top surface;

a plurality of light emitters and a plurality of light detectors, each light emitter being paired with a light detector whereby emitted light from the light emitter of a pair is intended to be reflected to the light detector of the pair, and wherein pairs of light emitters and light detectors are aligned with and disposed below each of said substantially transparent areas below said top surface;

a plurality of visible light emitters aligned with and disposed below each of said substantially transparent areas;

a microprocessor including a dark ambient value stored for each of said plurality of light detectors, said dark ambient value being substantially equal to a value detected by a detector at a substantially transparent area when a finger encompasses said substantially transparent area when a finger encompasses said substantially transparent area thereby blocking ambient light to said light detector at said substantially transparent area, said microprocessor being configured to scan said plurality of light detectors and to determine a detected value for each of said plurality of light detectors, wherein when each of said plurality of light detectors is scanned and after said microprocessor determines at least one light detector has a detected value substantially equal to said dark ambient stored by said microprocessor, then an emitter paired with said light detector is turned on, wherein if a value detected by said light detector when said emitter is turned on is substantially equal to said dark ambient value stored by said microprocessor this identification is equated to no finger being detected, and if said value detected by said light detector when said emitter is turned on is substantially different from said dark ambient value, this identification is equated to a finger being detected, and said microprocessor provides a key code representative of a location to a host.

5. A keyboard with reflected light beam finger detection as claimed in claim 4 wherein said visible light emitters are diodes.

6. A keyboard with reflected light beam finger detection as claimed in claim 4 further including an embossed ring aligned with each of said plurality of substantially transparent areas protruding up from said top surface.

* * * * *